United States Patent
Hase et al.

[11] Patent Number: 5,878,097
[45] Date of Patent: *Mar. 2, 1999

[54] SIGNAL PROCESSING DELAY CIRCUIT

[75] Inventors: Kenichi Hase; Ryutaro Horita; Kunio Watanabe, all of Yokohama; Yoshiteru Ishida, Odawara; Takashi Nara; Hiroshi Kimura, both of Takasaki, all of Japan

[73] Assignee: Hitachi, Ltd., Tokyo, Japan

[*] Notice: The term of this patent shall not extend beyond the expiration date of Pat. No. 5,636,254.

[21] Appl. No.: 865,704

[22] Filed: May 30, 1997

Related U.S. Application Data

[63] Continuation of Ser. No. 430,534, Apr. 25, 1995, Pat. No. 5,636,254.

[30] Foreign Application Priority Data

Apr. 26, 1994 [JP] Japan ...................................... 6-088174
Sep. 2, 1994 [JP] Japan ...................................... 6-209927

[51] Int. Cl.$^6$ .............................. H04L 7/00; H04L 25/36; H04L 25/40
[52] U.S. Cl. ........................... 375/371; 370/516; 370/517
[58] Field of Search ............................ 375/371; 370/516, 370/517

[56] References Cited

U.S. PATENT DOCUMENTS

| | | |
|---|---|---|
| 5,036,297 | 7/1991 | Nakamura . |
| 5,119,045 | 6/1992 | Sato . |
| 5,295,164 | 3/1994 | Yamamura . |
| 5,404,250 | 4/1995 | Hase et al. . |
| 5,636,254 | 6/1997 | Hase et al. .............................. 375/371 |

*Primary Examiner*—Stephen Chin
*Assistant Examiner*—Mohammad Ghayour
*Attorney, Agent, or Firm*—Antonelli, Terry, Stout & Kraus, LLP

[57] ABSTRACT

A signal processing delay circuit is fabricated as a semiconductor integration circuit to cope with increase in the data transfer speed and data recording and reproducing density on a recording medium. In the delay circuit, the amount of delay of a reference delay circuit of a delay PLL is controlled to take a fixed value independent of deviation in quality of the semiconductor circuit, change in power, and alteration in temperature. A control signal supervising the delay amount of the reference delay circuit is employed to control amounts of delay of input signals supplied to a window adjustment delay circuit of a window adjustment circuit and a T/2 generation delay circuit generating a synchronizing signal. Each of these delay circuits includes an analog variable delay circuit having the same configuration. The window adjustment delay circuit is supervised by a signal obtained by weighting the control signal by a D/A converter. A data acquisition circuit and a data write circuit each include an analog variable delay circuit.

3 Claims, 11 Drawing Sheets

$$Td = \frac{Cp \cdot VBE}{I1}$$

$$I1 = \frac{1}{n} \cdot \frac{k2}{k1} \cdot I0$$

MEASURED RESULTS OF
DEPENDENCE OF DELAY ON
POWER VOLTAGE OF DELAY
CIRCUIT

MEASURED RESULTS OF
DEPENDENCE OF DELAY
ON TEMPERATURE

SIGNAL PROCESSING DELAY CIRCUIT

This application is a continuation of application Ser. No. 08/430,534, filed Apr. 25, 1995, now U.S. Pat. No. 5,636,254, issued Jun. 3, 1997.

BACKGROUND OF THE INVENTION

The present invention relates to a signal processing delay circuit using a high-precision delay line and, in particular, to a signal processing delay circuit which copes with high-density data recording and high-speed data transfer according to improvement of reproduction margin in a signal processing section of a magnetic disk device.

Referring now to FIG. 10, description will be given of a conventional signal processing delay circuit according to an application example thereof to a data acquisition circuit in a magnetic disk device which acquires reproduction data in a data reproducing operation.

FIG. 10 shows the configuration of a data acquisition circuit of the conventional technology in which a window adjustment circuit 101 includes a fixed-delay N-tap delay 102 having N taps, a selector 103 for selecting either one of the outputs from N taps of the delay 102, and a register 104 for accumulating therein selection information of the selector 103.

Next, operation of the window adjustment circuit 101 will be described. Read data 107 read from a disk for reproduction thereof is fed to the N-tap delay 102. An output from a central tap of the delay 102 is inputted to a read phase-locked loop (PLL) 105. From the PLL 105, a clock signal is produced at a timing synchronized with the read data 107. Moreover, in response to the read data 107 fed to the N-tap delay 102, the selector 103 is controlled according to beforehand specified selection information of the register 104 so as to select an optimal tap from the N taps of the delay 102, thereby outputting data from the selected tap. The clock signal outputted from the read PLL 105 and the data outputted from the selector 103 are both supplied to a data latch 106. In the latch 106, the data from the selector 103 is latched by a clock signal from the read PLL 105 to be thereafter outputted as synchronous read data 108.

The N-tap delay 102 as a signal processing delay circuit in the conventional window adjustment circuit 101 includes a plurality of stages of logic gate delay elements.

Moreover, a write compensation circuit in which data positions are compensated for according to a data pattern in the data recording operation includes also a similar signal processing delay circuit.

The prior art is attended with the following problem. Namely, since the signal processing delay circuit includes a plurality of stages of logical gates each having a fixed delay amount, the N-tap delay 102 constituting a window adjusting circuit of the data acquisition circuit has an amount of delay varying with respect to, for example, deviation in quality of the circuit chip, fluctuation in power, and change in temperature. This consequently leads to deviation of the center of the adjusted window.

Furthermore, for the signal processing delay circuit of the type used in the disk device or the like, the minimum delay interval between the taps is limited to the amount of delay associated with one logical gate constituting the circuit. In consequence, it is impossible to achieve a fine delay adjustment with a higher precision for the amount of delay less than that equivalent to one logical gate. For example, the N-tap delay 102 constituting the window adjustment circuit of the data acquisition circuit cannot appropriately set the center of window with a high accuracy. Consequently, data including a large amount of jitter components due to the peak shift or the like cannot be acquired with a high precision, which leads to difficulty in increasing the data recording density. In a high-speed data transfer, the window width becomes smaller and the window loss due to deviation of the center of window becomes relatively increased, which leads to difficulty in increasing the data transfer speed.

Moreover, since the write compensation circuit of the data write circuit also includes a similar signal processing delay circuit, relative positions between the bits of data to be written on a disk cannot be compensated for with a high precision.

SUMMARY OF THE INVENTION

It is therefore an object of the present invention to provide a signal processing delay circuit constituting a stable high-precision switch adjustment circuit including a delay circuit having an amount of delay invariable with respect to non-uniformity in quality of the manufactured circuit chip, alteration in power, and change in temperature.

Another object of the present invention is to provide a data acquisition circuit including a window adjustment circuit which includes an analog variable delay circuit capable of achieving a high-precision adjustment of delay in the unit of a fine delay amount and which is capable of conducting a fine adjustment of delay without causing deviation in the amount of delay, thereby coping with increase in the data density and data transfer speed in the data read and write operations.

Still another object of the present invention is to provide a stable high-precision signal processing delay circuit constituting a write compensation circuit of a data write circuit, the delay circuit having an amount of delay invariable with respect to the variation in quality of the fabricated circuit chip, alteration in power, and change in temperature.

Further another object of the present invention is to provide a data write circuit which includes an analog variable delay circuit capable of achieving a high-precision adjustment of delay in the unit of a fine delay amount and which is capable of conducting a fine adjustment of delay without causing deviation in the amount of delay, thereby coping with increase in the data density and data transfer speed in the data read and write operations.

To achieve the objects above, according to an aspect of the present invention, the signal processing delay circuit includes first delay means including a first analog variable delay circuit of which the amount of delay is controlled according to an external reference signal and second delay means including a second analog variable delay circuit in which the amount of delay of an input signal as an object of processing is controlled according to a delay amount control signal generated from the first delay means. The first delay means favorably accomplishes a delay amount control operation according to a closed loop control operation.

In operation of the constitution above, the first analog variable delay circuit of the first delay means is supervised according to a stable external reference signal such that the amount of delay thereof matches a delay time decided by the external reference signal. The delay amount control operation is desirably carried out through a closed loop control operation, which leads to a highly accurate control operation independent of the variation in quality of the circuit chip, deviation in power, and change in temperature. The amount of delay of the second analog variable delay circuit of the second delay means delaying a signal as an object of processing is supervised according to the delay amount control signal obtained from the first delay means. The first and second analog variable delay circuits are configured in the same structure. Thanks to the provision, the second analog variable delay circuit also has a highly precise amount of delay invariable with respect to the fabrication variation in quality of the circuit chip, deviation in power, and alteration in temperature.

Moreover, there is disposed means for weighting the delay amount control signal to weight the signal controlling the amount of delay so as to output the weighted signal to the second analog variable delay circuit. As a result, for the second analog variable delay circuit, the amount of delay is controlled in a wide range and the window width is expanded.

In addition, there may be arranged means for setting the center of window with a high accuracy. Particularly, when there is provided a third analog variable delay circuit, the center of window can be easily set with a high precision.

BRIEF DESCRIPTION OF THE DRAWINGS

These and other objects and advantages of the present invention will become apparent by reference to the following description and accompanying drawings wherein:

FIGS. 18A to 18B are graphs collectively showing examples of effect of the window adjustment circuit as an embodiment of the present invention in which FIG. 18A shows measured results of dependence of an LSI delay circuit on power voltage and FIG. 18B shows measured results of dependence of the delay circuit on temperature.

DESCRIPTION OF THE PREFERRED EMBODIMENTS

Next, description will be given of an embodiment according to the present invention by reference to FIGS. 1 to 9, 11 to 15, and 16A, 16B, 17, 18A, and 18B.

Figure 1:
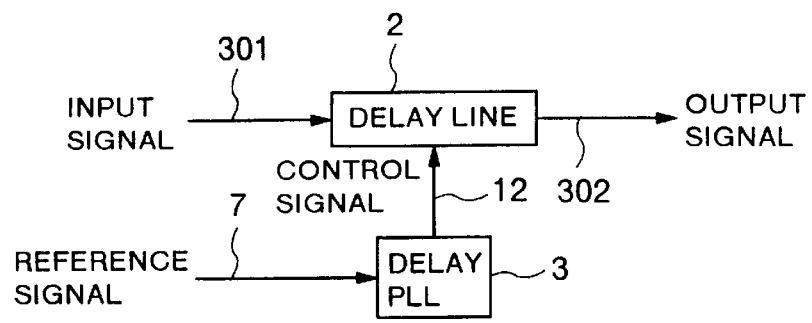
FIG. 1 is a diagram showing an embodiment of the signal processing delay circuit according to the present invention.

FIG. 1 shows an outline of constitution of an embodiment of an on-chip signal processing delay circuit according to the present invention. The delay circuit includes a delay line 2 and a delay PLL 3. The delay PLL 3 receives as an input thereto a reference signal 7 showing a fixed frequency independent of non-uniformity in quality of the LSI chip, variation in power, and alteration in temperature. The delay PLL 3 produces a control signal 12 through a closed loop control operation in response to the reference signal 7. The delay line 2 delays an input signal 301 as an object of processing according to the amount of delay supervised by the control signal 12. The delay line 2 is controlled to have an amount of delay independent of variation in quality of the circuit chip, deviation in power, and change in temperature so as to send therefrom an output signal 302 as an object of processing.

Figure 2:
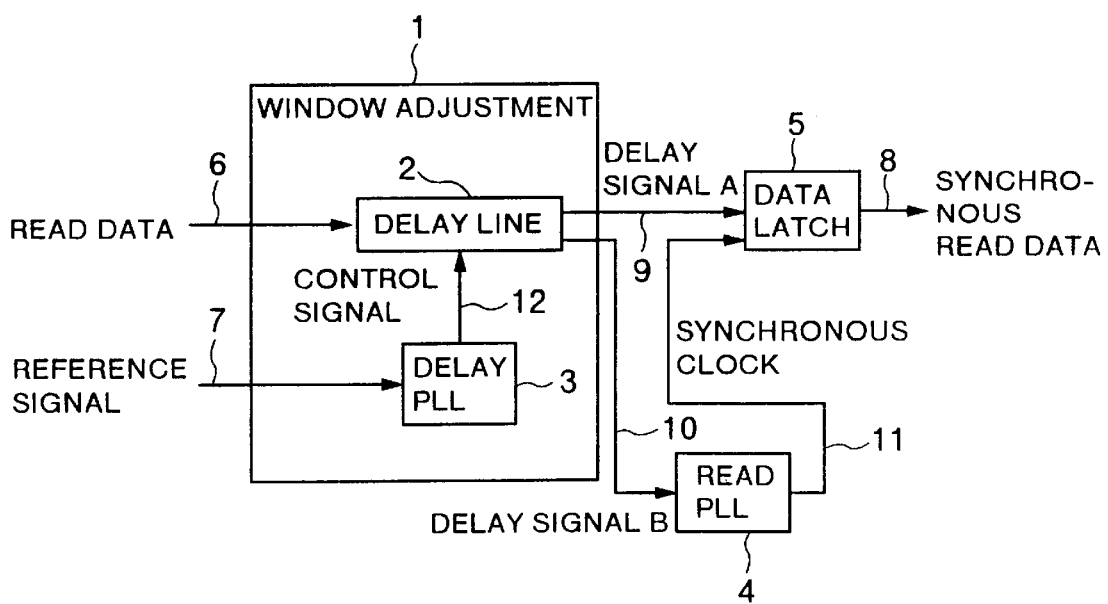
FIG. 2 is a diagram showing an embodiment of the data acquisition circuit according to the present invention.

FIG. 2 shows in a block diagram of the configuration including an on-chip signal processing delay circuit applied to a window adjustment circuit of a data acquisition circuit of a disk device according to the present invention. In this structure, a window adjustment circuit 1 includes a delay line 2 to be controlled in an analog fashion and a delay PLL 3 for controlling the delay line 2. Read data 6 which has been loaded on a disk of a disk device is read therefrom to be fed to the delay line 2. The delay line 2 outputs two delay signals A 9 and B 10 respectively having mutually independent amounts of delay. The delay signal B 10 is inputted to a read PLL 4. The read PLL 4 outputs therefrom a synchronous clock signal 11 synchronized with the delay signal B 10. The synchronous clock signal 11 is fed to a data latch circuit 5 together with the delay signal A 9.

The data latch circuit 5 outputs therefrom synchronous read data 8, which is the delay signal A9 latched in advance by the synchronous clock signal 11. In this situation, the stable reference signal 7 having a fixed frequency independent of deviation in quality of the circuit chip, change in power, and variation in temperature is supplied to the delay PLL 3. As a result, there is accomplished the closed loop control operation in response to the reference signal 7 so as to produce the control signal 12. The delay line 2 is supervised by the control signal 12 to develop an amount of delay independent of non-uniformity in quality of the chip, alteration in power, deviation in temperature.

Figure 3:
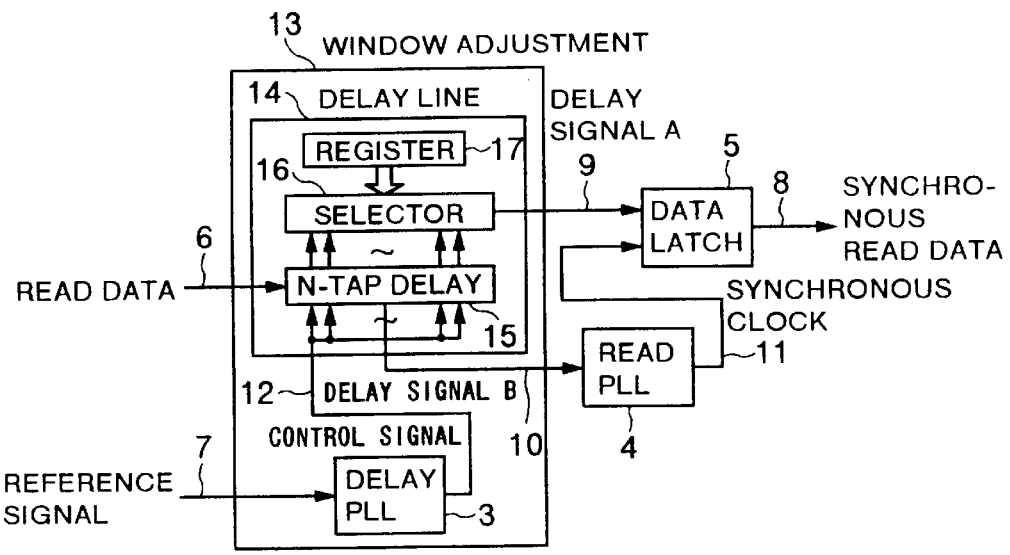
FIG. 3 is a diagram showing a first configuration example of the window adjustment delay line of FIG. 2.

FIG. 3 shows a first detailed example of constitution of the delay line 2 of the window adjustment circuit 1 shown in FIG. 2. A window adjustment circuit 13 of FIG. 3 (corresponding to the window adjustment circuit 1) has a delay line 14 (corresponding to the delay line 2) including an N-tap delay 15 which has N taps and which includes delay lines controllable in analog fashion, a selector 16 for selecting one of the outputs from N taps, and a register 17 for accumulating therein selection information of the selector 16. The read data 6 read from the disk is fed to the N-tap delay 15 such that the delay signal B 10 is outputted from the central tap of the N-tap delay 15. Moreover, according to information accumulated in the register 17 selected in advance, one of the N outputs of the delay 15 is selected by the selector 16. The selected signal is outputted as the delay signal A 9. In the similar manner as for FIG. 2, the delay signal B 10 is delivered to the read PLL 4. Resultantly, the read PLL 4 outputs the synchronous clock signal 11 synchronized with the delay signal B 10. The clock signal 11 is fed to the data 15 latch 5 together with the delay signal A 9. In the data latch 5, the delay signal A 9 is latched by the synchronous clock signal 11 to be then outputted as synchronous read data 8. In this situation, a stable reference signal 7 having a fixed frequency independent of fluctuation in quality of the chip, variation in power, and change in temperature is inputted to the delay PLL 3 such that the closed loop control operation is conducted according to the reference signal 7 so as to produce the control signal 12. The N-tap delay circuit 15 is supervised to have a fixed amount of delay independent of deviation in quality of the circuit chip, change in power, and variation in temperature, thereby improving precision of the amount of delay for each tap.

Figure 4:
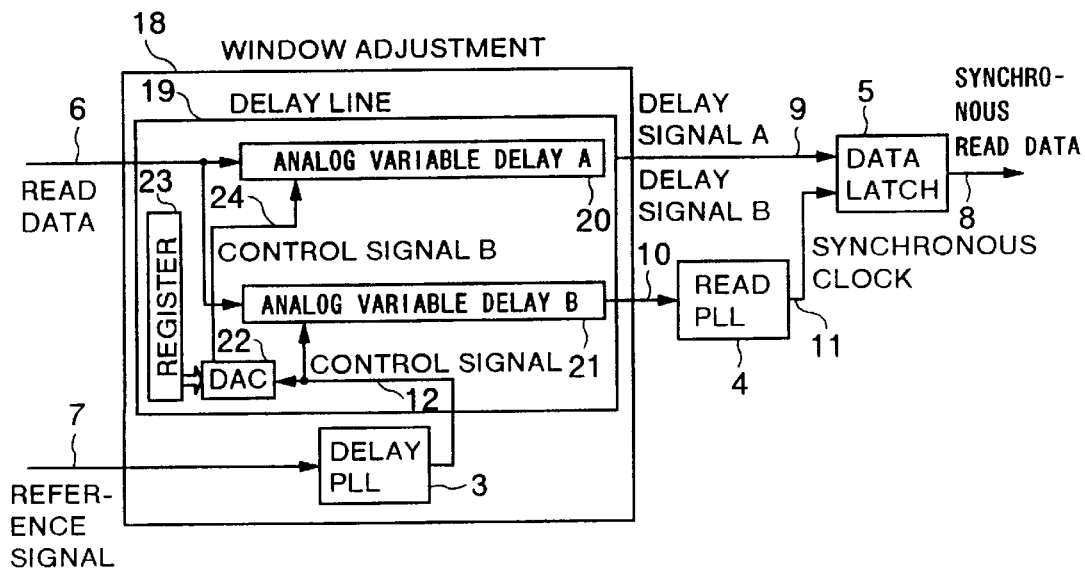
FIG. 4 is a diagram showing a second configuration example of the window adjustment delay line of FIG. 2.

FIG. 4 shows a second detailed example of structure of the delay line 2 of the window adjustment circuit 1 shown in FIG. 2. A window adjustment circuit 18 of FIG. 4 includes a delay line 19 including analog variable delay circuits A 20 and B 21 each being a single-output delay line controllable in an analog fashion, a digital-to-analog (D/A) converter DAC 22 for weighting the control signal, and a register 23 for accumulating weighting information of the DAC 22. Read data 6 read from the disk is concurrently fed to the analog variable delay circuits A 20 and B 21, which in turn output delay signals A 9 and B 10, respectively. The analog variable delay circuit B 21 is supervised by the control signal 12 to develop a fixed amount of delay independent of alteration in quality of the chip, change in power, and variation in temperature. The analog variable delay circuit A 20 is controlled by a control signal B 24 obtained by weighting the control signal by the DAC 22 according to information of a register beforehand selected so as to have a variable amount of delay independent of deviation in quality of the circuit chip, change in power, and variation in temperature. The delay signals A 9 and B 10 are processed in the similar manner as for the example of FIG. 2. As a result, there can be achieved quite a fine adjustment of the amount of delay.

Figure 5:
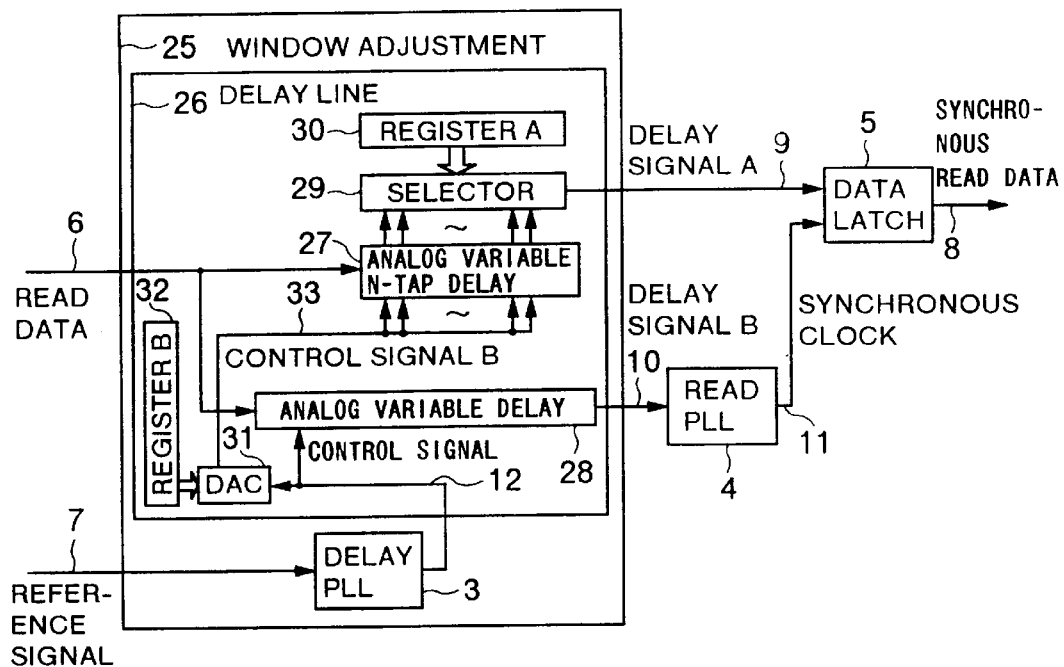
FIG. 5 is a diagram showing a third configuration example of the window adjustment delay line of FIG. 2.

FIG. 5 shows a third detailed example of structure of the delay line 2 of the window adjustment circuit 1 shown in FIG. 2. The window adjustment circuit 25 of FIG. 5 includes a delay line 26 including an analog variable N-tap delay circuit 27 which includes N taps and delay lines controllable in an analog fashion, a selector 29 for selecting one of N outputs of the delay circuit 27, a register A 30 for accumulating selection information of the selector 29, an analog variable delay circuit 28 including a single-output delay line controllable in an analog manner, a D/A converter DAC 31 for weighting the control signal 12, and a register B 32 for accumulating weighting information of the DAC 31. Read data 6 read from the disk is concurrently fed to the analog variable N-tap delay circuit 27 and analog variable delay circuit 28. The delay circuit 28 outputs a delay signal B 10. According to information accumulated in the register A 30, one of the N taps of the delay circuit 27 is selected by the selector 29 such that a signal is outputted as the delay signal A 9 from the selected tap.

The analog variable delay circuit 28 operates in the same manner as for the delay circuit B 21. The analog variable N-tap delay circuit 27 is supervised by a control signal B 33 obtained by beforehand weighting the control signal by the DAC 31 according to information of the register 32 selected in advance so as to develop a variable amount of delay independent of variation in quality of the circuit chip, change in power, and alteration in temperature. The delay signals A 9 and B 10 are processed in the same manner as for the example of FIG. 2. Thanks to operations above, there can be conducted quite a fine adjustment of amount of delay in a wide range.

Figure 6:
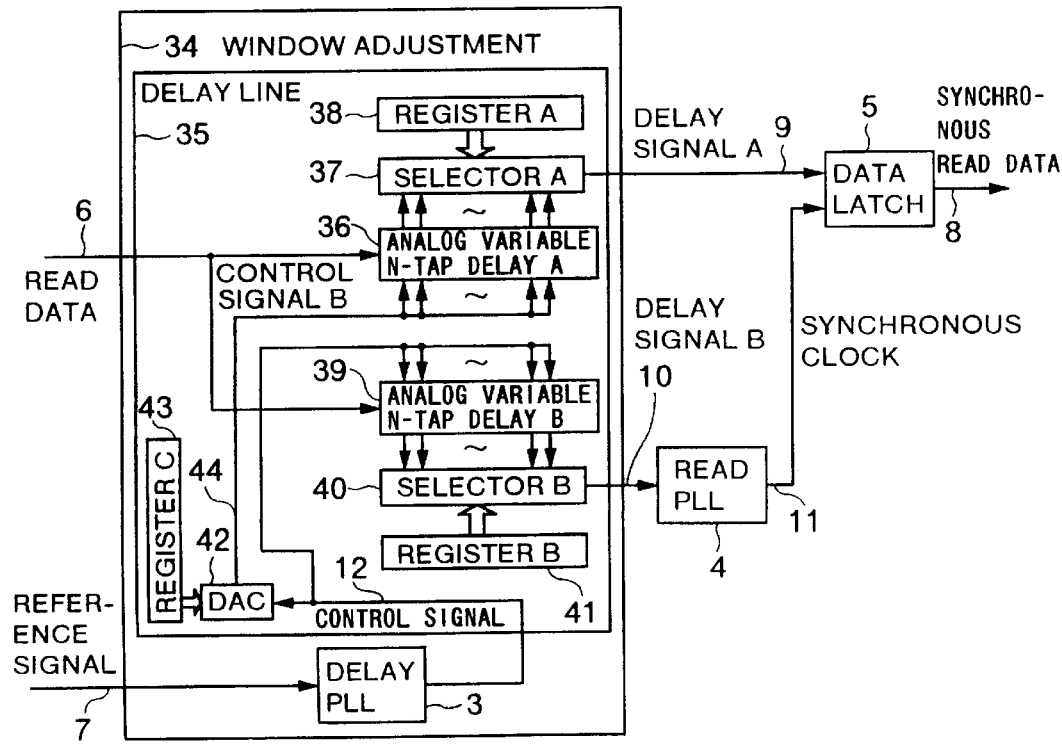
FIG. 6 is a diagram showing a fourth configuration example of the window adjustment delay line of FIG. 2.

FIG. 6 shows a fourth detailed example of constitution of the delay line 2 of the window adjustment circuit 1 shown in FIG. 2. The window adjustment circuit 34 of FIG. 6 includes a delay line section 35 including an analog variable N-tap delay circuit A 36 which includes N taps and first delay lines controllable in an analog fashion, a selector A 37 for selecting one of N outputs of the delay circuit A 36, a register A 38 for accumulating selection information of the selector 37, an analog variable N-tap delay circuit B 39 which includes N taps and second delay lines controllable in an analog fashion, a selector B 40 for selecting one of N outputs of the delay circuit B 39, a register B 41 for accumulating selection information of the selector B 40, a D/A converter (DAC) 42 for weighting the control signal, and a register C 43 for accumulating weighting information of the DAC 42. Read data obtained from the disk is supplied to the N-tap delay circuits A 36 and B 39. According to information beforehand accumulated in the register A 38, one of the N taps of the delay circuit B 36 is selected by the selector 37 such that a signal is outputted therefrom as the delay signal A 9. Moreover, according to information beforehand stored in the register B 41, one of the N taps of the delay circuit B 39 is selected by the selector B 41 such that a signal is delivered therefrom as the delay signal B 10.

The N-tap delay circuit B 39 is supervised by the control signal to have a fixed amount of delay independent of variation in quality of the chip, alteration in power, and change in temperature. The N-tap delay circuit A 36 is controlled by the control signal B 44 attained by beforehand weighting the control signal 12 by the DAC 42 according to information stored in the register A 38 in advance so as to develop a variable amount of delay independent of deviation in quality of the circuit chip, change in power, and alteration in temperature. The delay signals A 9 and B 10 are processed in the same manner as for the example of FIG. 2. With the provision, there can be carried out quite a fine adjustment of amount of delay in a wide range.

Figure 7:
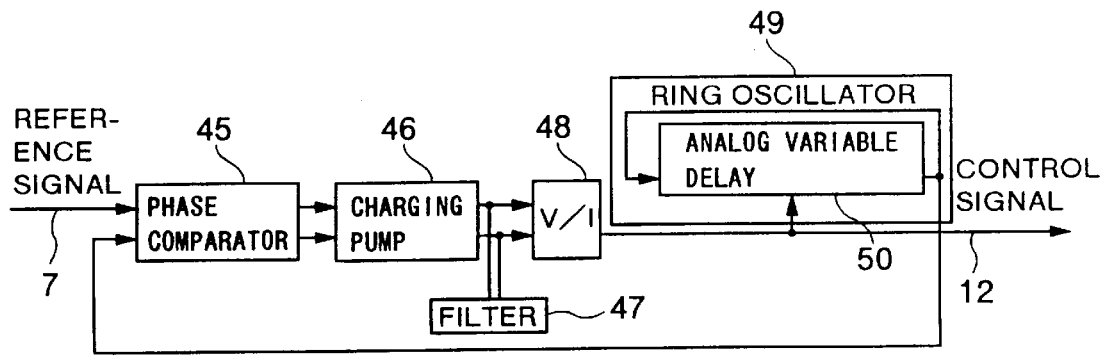
FIG. 7 is a diagram showing a first configuration example of the window adjustment delay PLL of FIG. 2.

FIG. 7 shows a first detailed example of structure of the delay PLL 3 of the window adjustment circuit 1 shown in FIG. 2. The delay PLL 3 of FIG. 7 includes a phase comparator 45, a charging pump 46, a loop filter 47, a voltage-to-current (V/I) converter 48, and an analog variable delay circuit 50. The phase comparator 45 receives as an input thereto a reference signal 7 having a fixed frequency independent of non-uniformity in quality of the circuit chip, alteration in power, and change in temperature. The reference signal 7 is compared with a signal from a ring oscillator 49 in which a loop is formed by the analog variable delay circuit 50 so as to output an error signal depending on the results of comparison. The charging pump 46 converts the error signal (voltage) from the phase comparator 45 into a current and outputs the current therefrom. The loop filter 47 transforms the current from the charging pump 46 into a voltage and outputs the voltage signal therefrom. The V/I converter 48 converts the voltage from the loop filter 47 into a current and outputs the current signal as a control signal 12. In this situation, the control signal 12 is inputted also to the analog variable delay circuit 50 to control the amount of delay and alters the output frequency of the ring oscillator 49. The constituent components collectively form a phase-locked loop for producing a control signal 12 to generate an amount of delay independent of variation in quality of the circuit chip, change in power, and deviation in temperature. In this situation, thanks to constitution of the loop filter 47, the PLL functions as a PLL having at least a second-order pull-in response.

Figure 8:
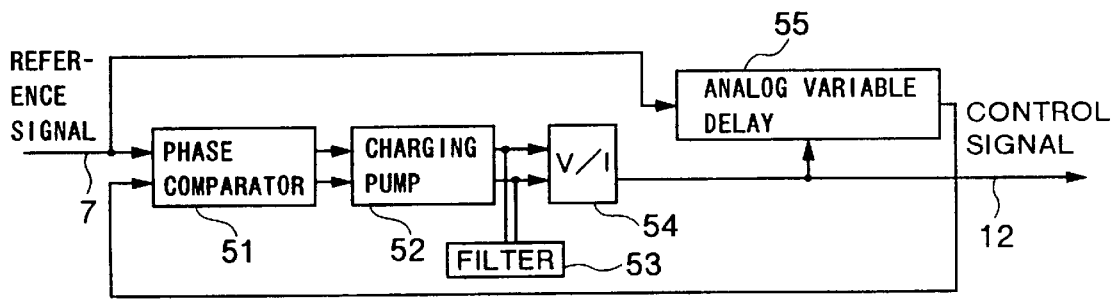
FIG. 8 is a diagram showing a second configuration example of the window adjustment delay PLL of FIG. 2.

FIG. 8 shows a second detailed example of structure of the delay PLL 3 of the window adjustment circuit 1 shown in FIG. 2. The delay PLL of FIG. 8 includes a phase comparator 51, a charging pump 52, a loop filter 53, a V/I converter 54, an analog variable delay circuit 55. The configuration is obtained by simplifying the structure of FIG. 7. The phase comparator 51 receives as an input thereto a reference signal 7 having a fixed frequency independent of non-uniformity in quality of the circuit chip, variation in power, and change in temperature. The reference signal 7 is compared with a signal from the analog variable delay circuit 55 to which the reference signal 7 is supplied, thereby outputting an error signal depending on cases. The charging pump 52 transforms the error signal from the phase comparator 51 into a current and outputs the current signal therefrom. The loop filter 53 converts the current from the charging pump 52 into a voltage and outputs the voltage signal therefrom. The V/I converter 54 transforms the voltage from the loop filter 53 into a current and outputs the current signal as a control signal 12. In this situation, the control signal 12 is inputted also to the analog variable delay circuit 55 to control the amount of delay and changes the amount of delay of the delay 55. These components collectively constitute a phase-locked loop (PLL) for outputting a control signal to generate an amount of delay associated with one period of the reference clock signal 7 independent of deviation in quality of the circuit chip, variation in power, and change in temperature. In this case, due to structure of the loop filter, the PLL operates as a PLL having at least a first-order pull-in response.

Furthermore, in the operation above, when a signal having a phase reverse to that of the signal inputted to the analog variable delay circuit 55 is supplied to the phase comparator 51, there can be produced a control signal to generate an amount of delay equivalent to half the period of the reference clock signal 7.

Figure 9:
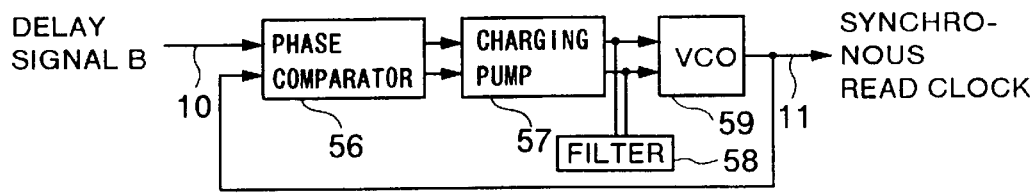
FIG. 9 is a diagram showing a configuration example of the window adjustment read PLL of FIG. 2.
Figure 10:
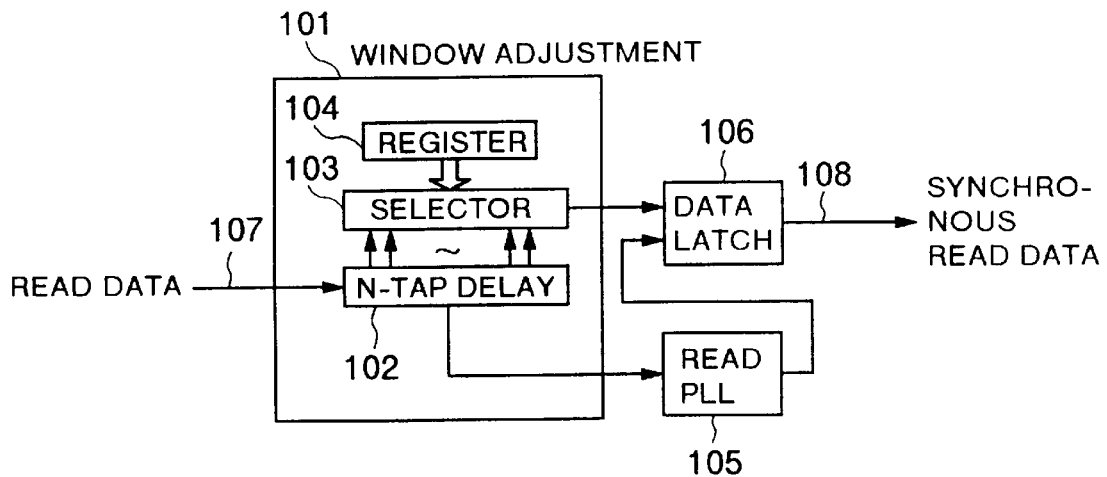
FIG. 10 is a diagram showing a configuration example of the conventional window adjustment circuit.

FIG. 9 shows a detailed configuration example of the read PLL 4 of the window adjustment circuit 1 shown in FIG. 2. The read PLL of FIG. 9 includes a phase comparator 56, a charging pump 57, a loop filter 58, and a voltage-controlled oscillator (VCO) 59. Read data 6 is delayed by the window adjustment circuit 1 to be a delay signal B 10. The signal is fed to the phase comparator 56 to be compared with a synchronous clock signal 11 from the VCO 59 so as to generate an error signal depending on cases. The loop filter 58 transforms the current from the charging pump 57 into a voltage to output a voltage signal. The VCO 59 produces as the synchronous clock signal therefrom a clock signal having a frequency corresponding to the voltage from the loop filter 58. The circuit configuration forms a phase-locked loop to generate a synchronous clock signal synchronized with the delay signal B 10.

Figure 11:
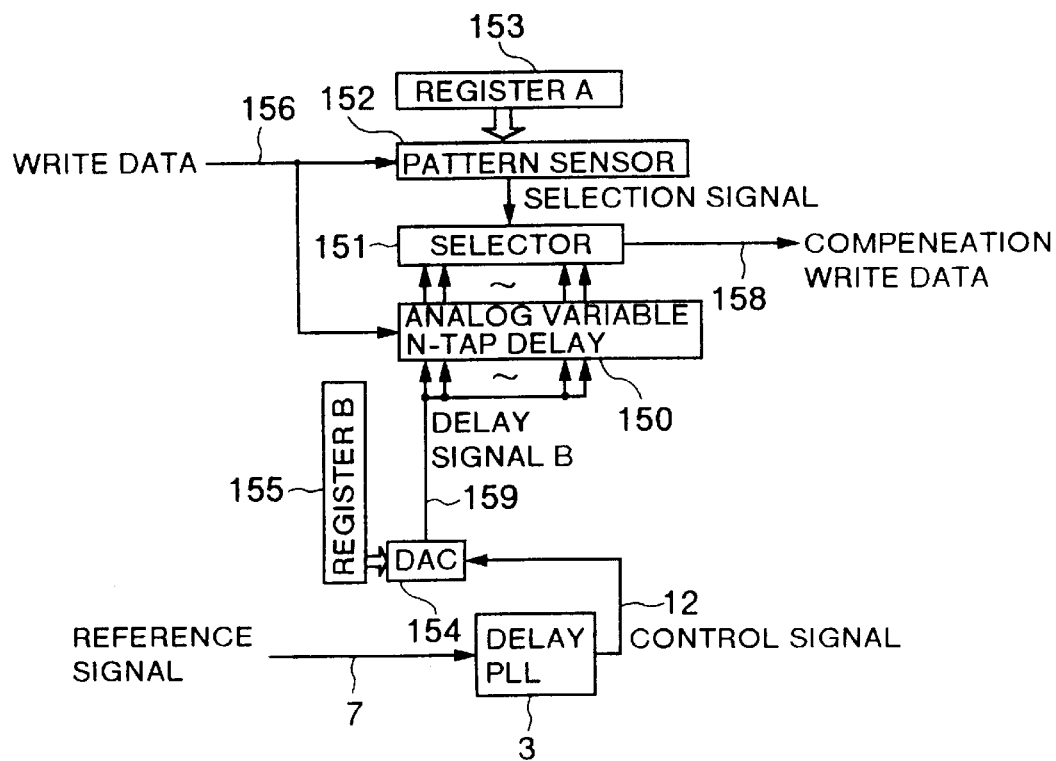
FIG. 11 is a diagram showing the configuration of an embodiment of a data write circuit according to the present invention.

FIG. 11 shows a construction example in which the signal processing delay circuit of the present invention is applied to a write compensation circuit of a data write circuit. The write compensation circuit includes an analog variable N-tap delay circuit 150 including N taps and delay lines controllable in an analog fashion, a selector 151 for selecting one of the outputs from N taps, a pattern detector 152 for detecting a data pattern of write data 156 inputted thereto and outputting a selection signal 157 for the selector 151, a register A 153 for accumulating therein tap information to be referenced by the pattern detector 152 to generate the selection signal 157, a delay PLL for creating a control signal 12 from a reference signal 7, a digital-to-analog converter (DAC) 154 for weighting the control signal 12, and a register B 155 for keeping therein weighting information of the DAC 154. Constitution of the pattern detector 152 has been known and is used to change in an analog manner the amount of delay of each tap by forecasting interference between waveforms, and hence any detailed description thereof will be unnecessary.

Write data 156 to be written on a write medium is fed to the pattern detector 152 such that the selection signal 157 is produced according to the bit pattern of the write data 156. In this operation, an optimal correspondence is established between the bit pattern and the selection signal 157 according to tap information accumulated in the register A 153. The write data 156 inputted to the pattern detector 152 is simultaneously fed also to the analog variable N-tap delay circuit 150 such that the selector 151 selects an optimal one of the N taps according to the selection signal 157 and delivers compensation write data 158 therefrom. The N-tap delay circuit 150 is supervised by the control signal B 159 obtained by weighting the control signal 12 by the DAC 154 according to information preset to the register B 155 so as to develop a variable amount of delay invariable with respect to fluctuation in quality of the circuit chip, change in power, and variation in temperature. Thanks to the provision, there can be implemented a write compensation circuit capable of achieving a fine adjustment of the amount of delay regardless of variation in quality of the circuit chip, alteration in power, and deviation in temperature.

Figure 12:
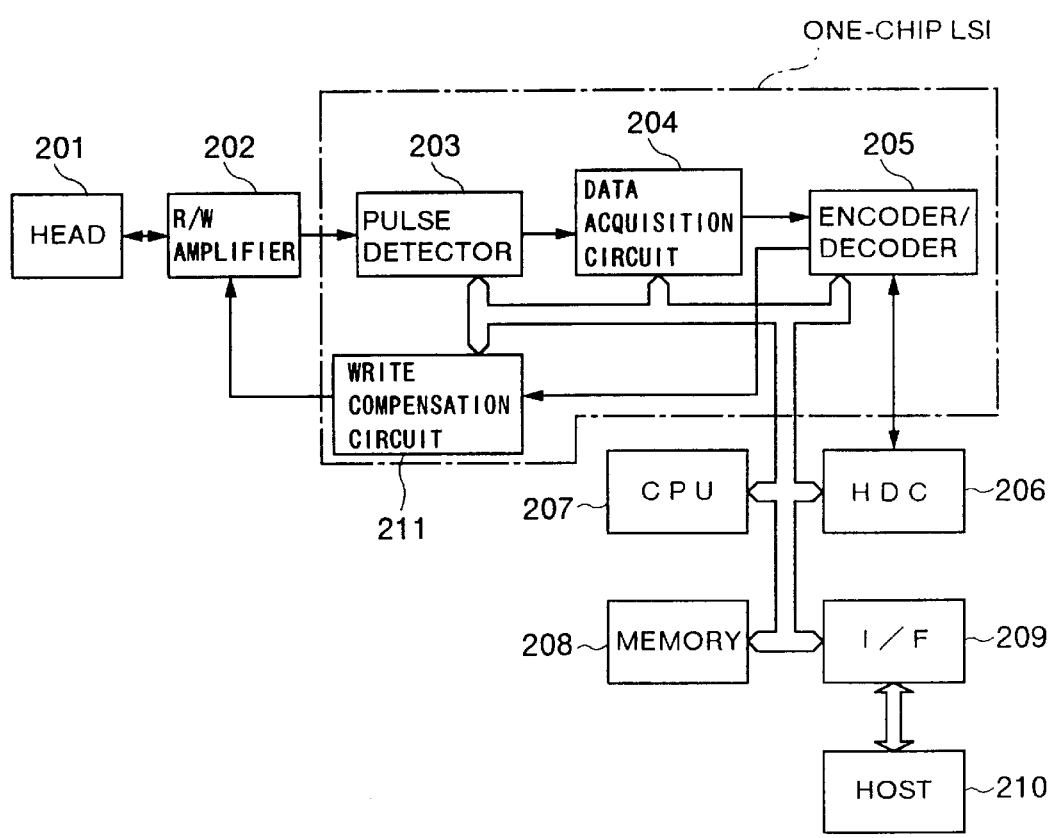
FIG. 12 is a diagram showing the configuration of an embodiment of a data acquisition circuit according to the present invention.

FIG. 12 shows an embodiment of a disk system to which the signal processing delay circuit of the present invention is applied. Specifically, the configuration of the application of the present invention to a magnetic disk apparatus includes a data acquisition circuit 204 and a write compensation circuit 211 of the present invention. The system further includes a read/write head 201 for achieving read and write operations of signals on a recording medium such as a magnetic disk, a read/write (R/W) amplifier 202 for amplifying signals, a waveform shaping or pulse detector circuit 203 for creating a code pulse from a read signal, an encoder/decoder 205 for encoding and decoding record signals or codes, a hard disk controller HDC 206 for controlling data, an interface (I/F) 209 for communicating data between a host computer and these constituent components, a central processing unit (CPU) 207 for controlling the HDC 206, I/F 209, etc., a memory 208 for accumulating therein data and the contents of processing, and a host computer 210 for processing data. The pulse detector 203, data acquisition circuit 204, encoder/decoder 205, and write compensation circuit 211 are fabricated in a one LSI chip.

Figure 13:
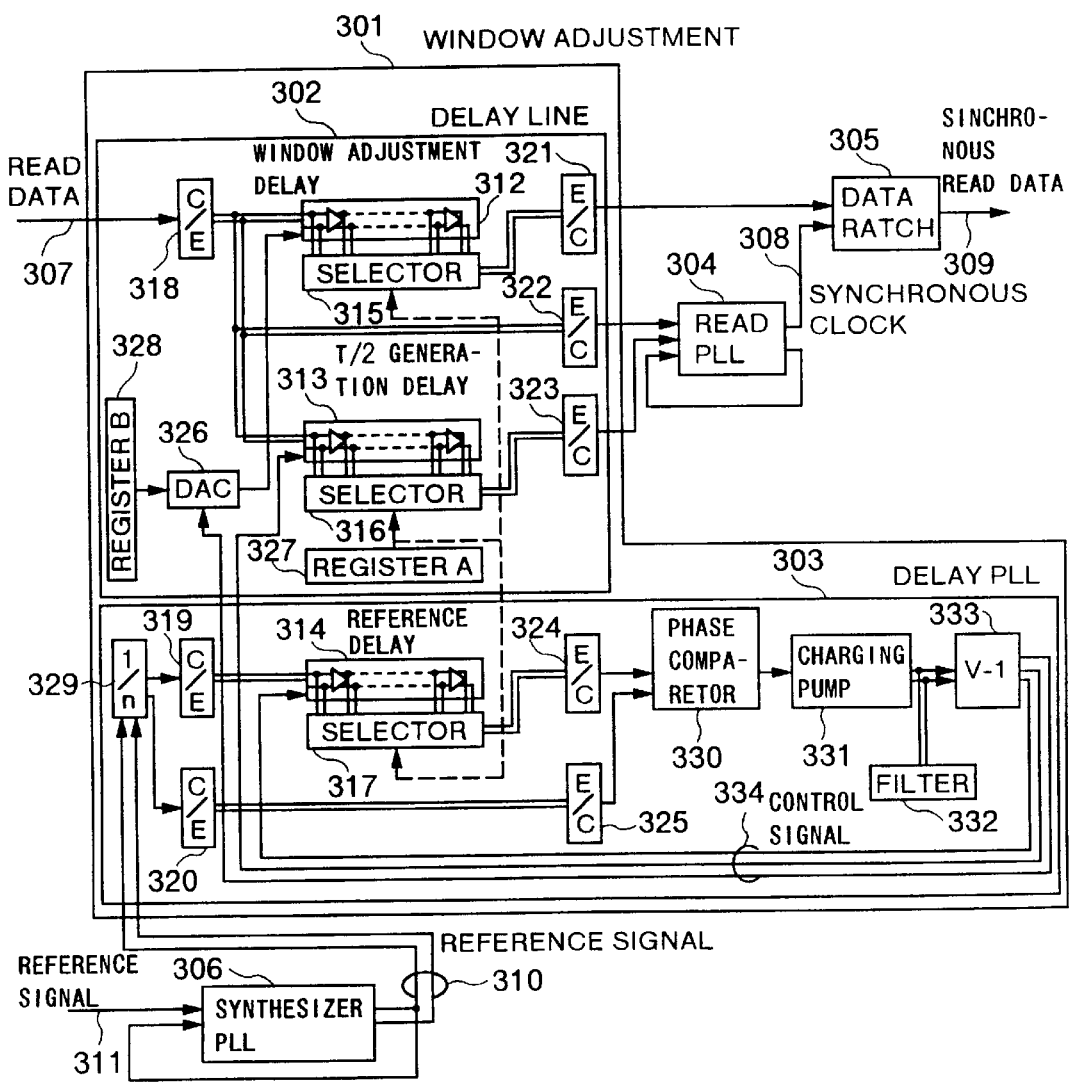
FIG. 13 is a block diagram showing the detailed configuration of the window adjustment delay line of FIG. 2.

FIG. 13 shows in detail an embodiment of the window adjustment delay line section according to the present invention. The embodiment is configured in the similar manner as for the example of FIG. 6 and the configuration is shown as a detailed circuit block fabricated as an LSI device.

The window adjustment circuit 301 includes a delay line section 302 and a delay PLL 303. Read data 307 read from a disk is fed to the window adjustment circuit 301 to be subjected to a phase adjustment. The resultant data is inputted to a data latch 305 together with a synchronous clock signal 308 from a read PLL 304 so as to be outputted as synchronous read data 309. On the other hand, a stable reference signal 311 from a crystal oscillator disposed at a position external of the LSI chip is supplied to a synthesizer PLL 306. The synthesizer PLL 306 creates a reference signal 310 to be fed to the delay PLL 303. The synthesizer PLL 306 continuously outputs a clock signal associated with the data transfer speed of the disk device in the data read and write operations. The frequency is decided, for example, for each recording zone on the disk. In the operation, according to the PLL control operation achieved in response to the reference signal 311, there is produced the reference signal 310 having an arbitrary frequency to cope with variation in the transfer speed of read data 307. In this example, the reference signal 310 includes two signals having the same frequency and a phase difference of 90° therebetween. The arbitrary frequency of the reference signal 310 can be determined by setting a register (not shown) integrated in the chip under control of a disk controller or the like.

First, in the delay line 302, the received data is transformed by a level conversion circuit (C/E) 318 from a complementary metal oxide semiconductor (CMOS) single level to an emitter-coupled logic (ECL) differential level for the following reasons. Namely, when compared with signal processing at the CMOS single level, signal processing at the ECL differential level is more advantageous with respect to the operation speed, noises, and dependence on power voltage. The level conversion is naturally unnecessary when the read data 307 includes signals at the ECL differential level. In addition, the conversion can also be dispensed with when there exists sufficient margins in the operation speed, noises, and dependence on power voltage. The data from the C/E converter 318 is inputted to a window adjustment delay circuit 312 constituting an analog variable N-tap delay circuit and a T/2 generating delay circuit 313 providing delay equivalent to half that of the circuit 312. From the respective delay circuits 312 and 313, the selectors 315 and 316 respectively select outputs from taps selected according to the register A 327. The selected signals are fed respectively to level conversion circuits, namely, E/C 321 and E/C 323 to be respectively restored to signals at the CMOS single level, thereby outputting the restored data signals. The amounts of delay respectively of the delay circuits 312 and 313 are supervised by a control signal 334 from the delay PLL 303. Consequently, there are configured high-precision delay circuits respectively having amounts of delay independent of deviation in quality of the circuit chip, change in power voltage, and variation in temperature. Furthermore, the window adjustment delay circuit 312 provides a relative delay difference with respect to the T/2 generation delay circuit 313 by adjusting the control signal 334 by the DAC 326 according to information preset to a register B 328.

In the delay PLL 303, the reference signal 310 from the synthesizer PLL 306 is divided by n by a 1/n divider 329 so as to deliver therefrom signals having a phase difference therebetween to two level conversion circuits C/E 319 and C/E 320. The converter C/E 319 produces an output to be fed to a reference delay circuit 314 constituting the analog variable N-tap delay circuit such that an output of the selector 317 selected according to the register A 327 is delivered via a level converter circuit E/C 324 to a phase comparator 330. The C/E 320 produces an output to be directly fed via a level conversion circuit E/C 325 to the phase comparator 330. The comparator 330 detects a phase difference between the two signals to send an error signal corresponding to the difference to a charging pump 331. The charging pump 331 creates a current according to the error signal. The loop filter 332 converts the obtained current signal into a voltage to be supplied to a V-I conversion circuit 333. The converter 333 transforms the voltage from the loop filter 332 into a current and sends the current as a control current (signal) 334 to the pertinent delay circuits 312 to 314. The window adjustment delay circuit 312, T/2 generation delay circuit 313, and reference delay circuit 314 are configured in the same manner and hence the control signal 334 is supplied to three signal lines connected thereto. As above, the control current 334 provides, for a phase difference between signals from the 1/n divider 329, an amount of delay undergone the PLL control operation. In other words, the reference delay circuit 314 is subjected to a closed loop control operation according to the control signal 334 so that the amount of delay thereof is equivalent to a period of time corresponding to the phase difference between the signals created from the 1/n divider circuit 329. At the same time, the delay circuits 312 and 313 are supervised also according to the control signal 334, the amounts of delay respectively thereof are independent of variation in quality of the LSI chip, deviation in power voltage, and change in temperature. Consequently, the amount of delay of each delay circuit can be attained with a high precision.

Figure 14:
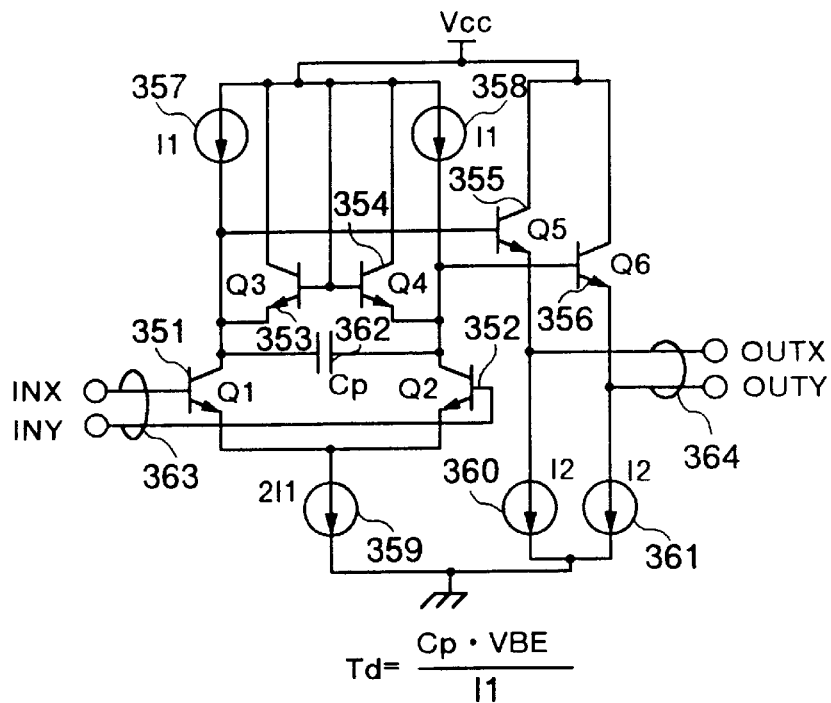
FIG. 14 is a block diagram showing an example of constitution of an analog variable delay cell of FIG. 13.

FIG. 14 shows a circuit configuration example of an analog variable delay cell for one tap of the analog variable N-tap delay circuit employed in the window adjustment delay circuit 312, T/2 generation delay circuit 313, and reference delay circuit 314. The cell circuit includes transistors Q1 351 and Q2 352 which provide a differential input, a timing capacitor Cp 362, clamping diodes Q3 353 and Q4 354, variable current sources I1 357 and 358 and 2I1 359, transistors Q5 355 and Q6 356 which constitute a buffer circuit, and fixed current sources I2 360 and 361. The current source 359 functions as a D/A converter. In this situation, the delay time Td between the initial points respectively of input signals (INX,INY) 363 and output signals (OUTX,OUTY) 364 is expressed as follows.

$$Td = \frac{Cp \cdot VBE}{I1} \quad (1)$$

where, Cp indicates an approximated value of timing capacitance, VBE denotes a base-emitter voltage of the clamping diodes Q3 and Q4, and I1 designates a variable current. Consequently, the delay time Td can be supervised by altering the variable current I1. In this connection, the constituent components I2 (360,361) configures an emitter-follower current source.

Figure 15:
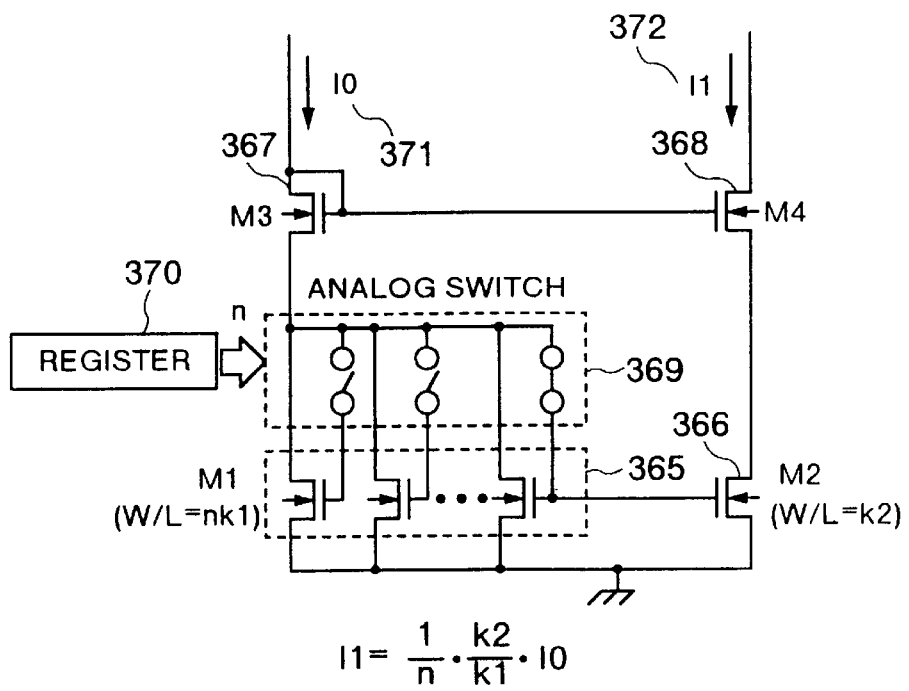
FIG. 15 is a block diagram showing a configuration example of a DAC circuit of FIG. 13.

FIG. 15 shows a circuit configuration example of the DAC 326 to adjust the amount of delay of the window adjustment circuit 312. The DAC circuit 326 includes a section M1 365 including a plurality of transistors, a transistor M2 366 which forms a current mirror in cooperation with M1 365, a plurality of analog switches 369 for establishing connection for each transistor of M1 365, a register 370 for controlling the analog switches 369, and a pair of transistors M3 367 and M4 368 which are linked in a cascode connection with the current mirror including M1 and M2. M1 is a composite transistor including a plurality of MOS transistors of which the transistor size W/L is k1. The transistor size of M1 is equivalently variable according to the number of transistors turned on. In this regard, W stands for the gate (channel) width of the MOS transistor and L indicates the gate (channel) length thereof. For MOS transistors, the transistor size is generally represented as W/L. M3 and M4 may be dispensed with when necessary.

Assume that the setting value of the register 370 (corresponding to the register B 328 of FIG. 13) is n. Under this condition, one of the analog switches 369 is selected according to the setting value n and is thereafter turned on. In the composite transistor M1, only the transistor connected to the switch turned on is activated. In this situation, assuming that the transistor thus turned on in M1 and transistor M2 have respectively the transistor sizes nk1 and k2, the relation between the input current I0 371 and output current I1 372 is represented as follows.

$$I1 = \frac{1}{n} \cdot \frac{k2}{k1} \cdot 10 \qquad (2)$$

Consequently, there is obtained the output current I1 inversely proportional to the register setting value n (due to an inversely proportional relationship, there are mutually different intervals therebetween). Connecting the output current I1 to the analog variable delay cell (FIG. 14), it is possible to attain an amount of delay Td proportional to the register value n. In consequence, the amounts of delay can be arranged with the same interval therebetween for the register setting value n.

Figure 16A:
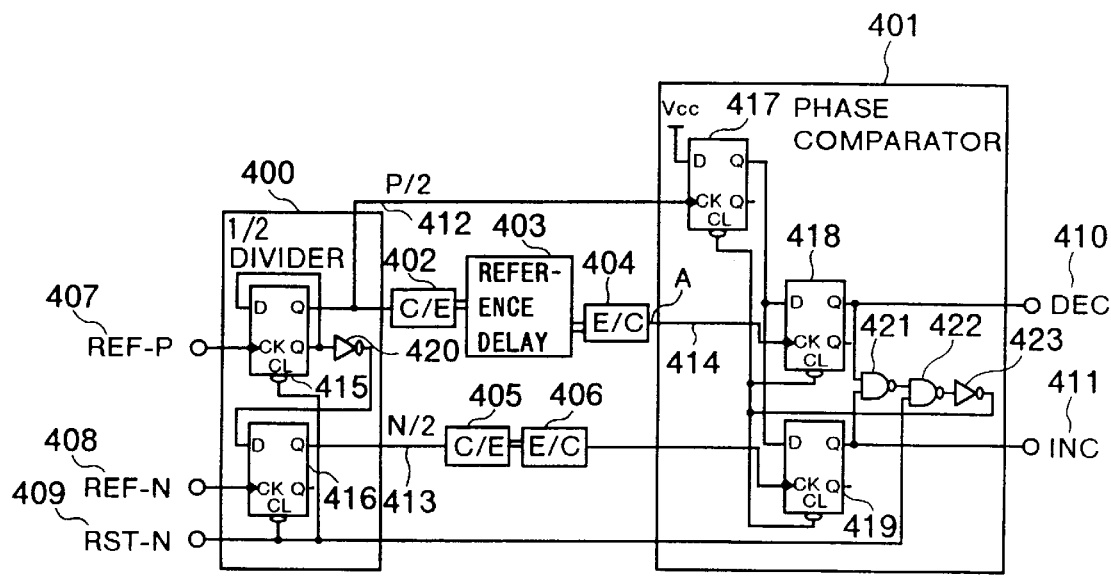
FIG. 16A is a block diagram showing a configuration example of a phase comparator of FIG. 13.
Figure 16B:
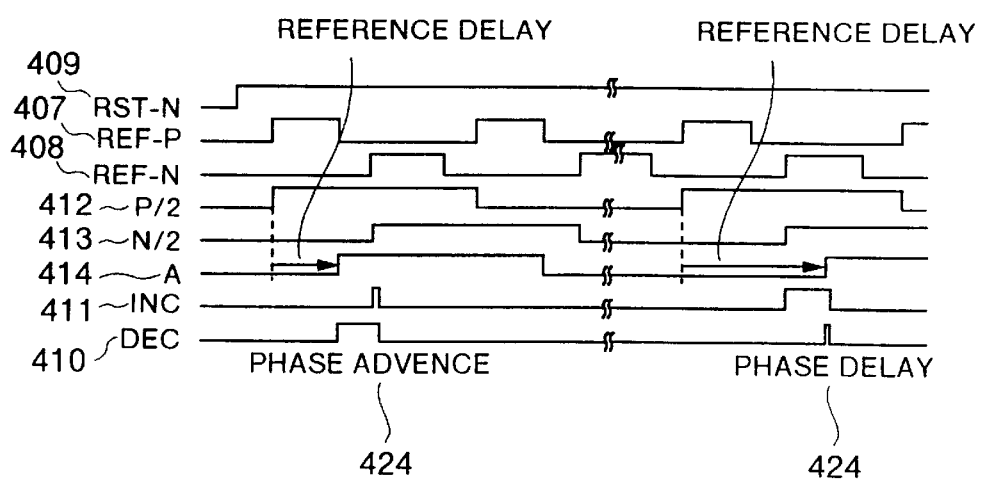
FIG. 16B is a signal timing chart showing operational waveforms of the circuit shown in FIG. 16A.

FIGS. 16A and 16B respectively show a circuit configuration example and a signal timing chart related to the phase comparator 330 and 1/n divider circuit 329 which constitute the delay PLL 303 (FIG. 13) of the present invention. In this example, the value n is set to two and there is utilized a 1/2 divider. The 1/2 divider 400 includes two D-type flip flop circuits 415 and 416 and an inverter 420. On receiving two reference signals REF-P 407 and REF-N 408 having a phase difference of 90° therebetween, the divider 400 produces two signals P/2 412 and N/2 413 having the same phase difference, each of the signals P/2 412 and N/2 413 having a frequency half that of the associated input signal.

The system includes a phase comparator 401 including three D-type flip flop circuits 417 to 419, two NAND cells 421 and 422, and an inverter 423. The signal P/2 412 from the divider 400 is passed through a C/E 402, a reference delay circuit 403, and an E/C 404 to be fed to the phase comparator 401. On the other hand, the signal N/2 413 from the divider 400 is fed through a C/E 405 and a C/E 406 to the phase comparator 401. Edges respectively of input pulses of these signals are compared with each other so as to produce a decrement (DEC) signal 410 or an increment (INC) signal 411 according to the phase difference therebetween. Moreover, the signal P/2 412 is supplied as a signal to control the phase comparison range directly to the phase comparator 401. In case where the amount of delay of the reference delay circuit 403 is less than the phase difference between the reference signals 407 and 408, there is outputted the DEC signal 410 according to the phase difference, resulting in a phase lead or advance 424. When the amount of delay of the reference delay circuit 403 is more than the phase difference between the reference signals 407 and 408, there is outputted the INC signal 411 according to the phase difference, which results in a phase delay 425. When the delay PLL 303 is in the locked state, the amount of delay of the reference delay circuit 403 is equal to the phase difference between the reference signals 407 and 408 and hence the DEC signal 410 becomes identical to the INC signal 411.

In this regard, according to the example shown in FIGS. 16A and 16B, there is obtained a reference amount of delay equivalent to that of delay corresponding to a phase difference of 90°. However, when the reference signal REF-P 408 is replaced by the reference signal REF-P 407, it is possible to attain a reference amount of delay equivalent to a phase difference of 180°.

Figure 17:
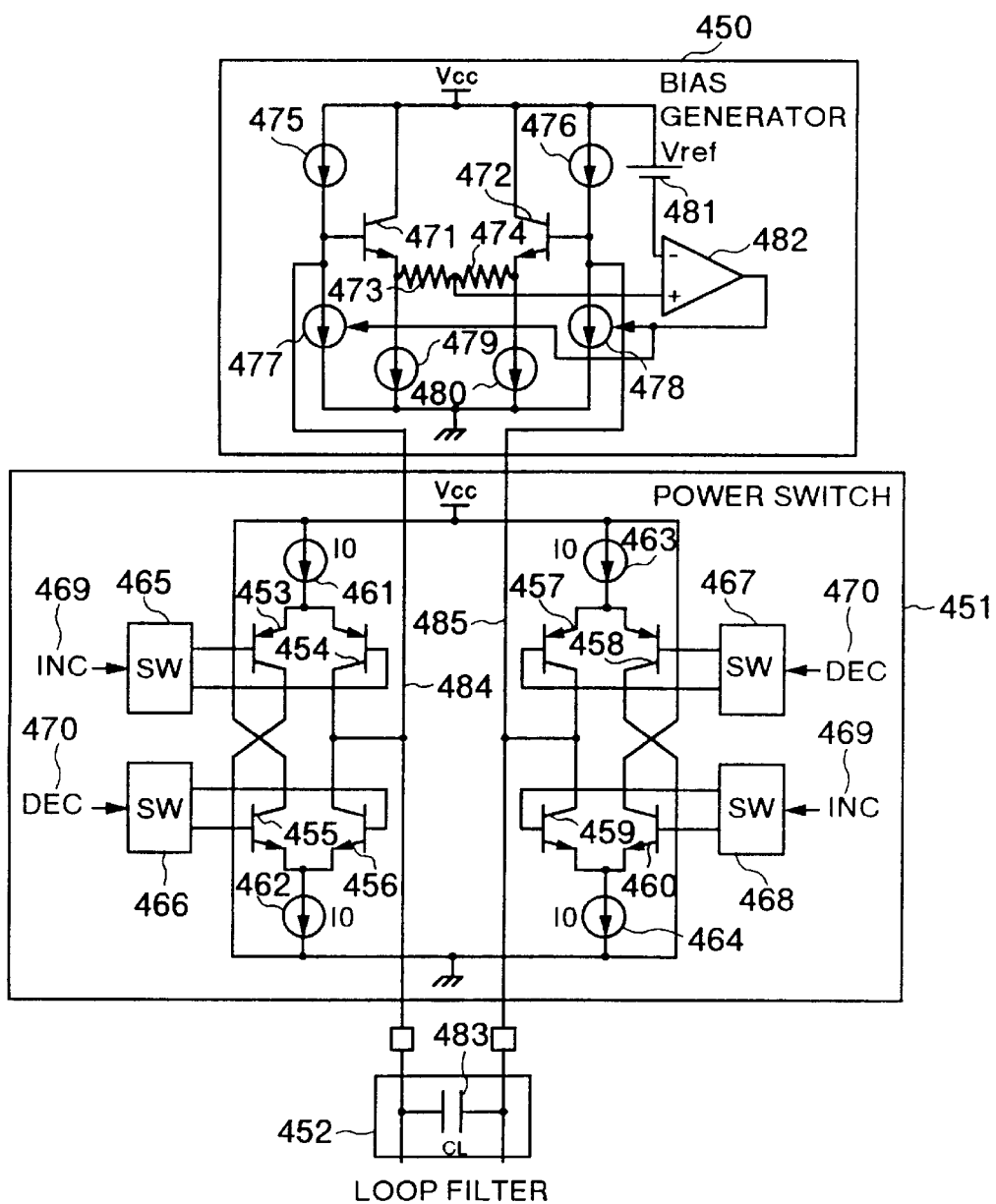
FIG. 17 is a block diagram showing a configuration example of a charging pump of FIG. 13.

FIG. 17 shows a circuit configuration example related to the charging pump circuit 331 and loop filter 332 constituting the delay PLL 303 of the present invention. The charging pump circuit 331 includes a current switch 451 and a bias generator circuit 450. The current switch 451 includes four sets of differential transistors 453 to 560, four current sources Io 461 to 464, and four analog switches SWs 465 to 468. The analog switches SWs 465 to 468 are supervised by an INC signal 469 and a DEC signal 470. When the INC signal 469 and DEC signals 470 are inputted to the current switch 451, there are produced pulse currents ±Io for the respective periods of pulse widths.

The bias generating circuit 450 is a unit to create a common bias for the differential output from the charging pump circuit. The circuit 450 includes a set of differential transistors 471 and 472, divider resistors 473 and 474, three sets of current sources 475 to 480, a voltage-controlled voltage source 482, and a reference voltage source Vref 481. There is conducted a feedback control operation in this circuit so that an intermediate voltage between output terminals 484 and 485 of the charging pump circuit is equal to the reference voltage Vref 481.

In the loop filter 452, the pulsated current from the charging pump circuit is smoothed into a current and the loop characteristic of the delay PLL 303 is decided. In this case, the loop filter 452 includes a capacitor CL 483.

Figure 18A:
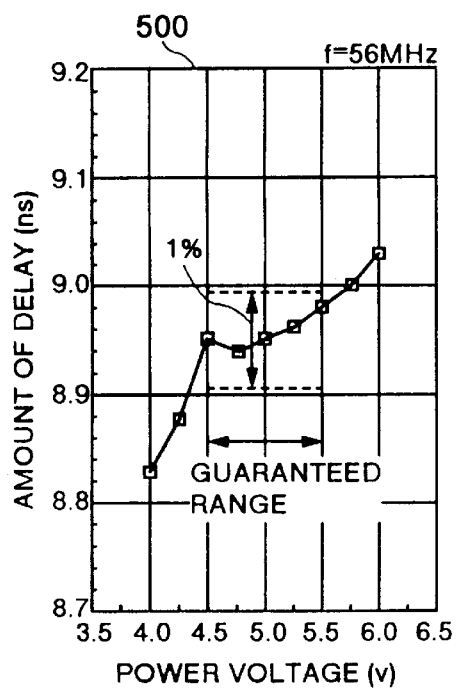
Figure 18B:
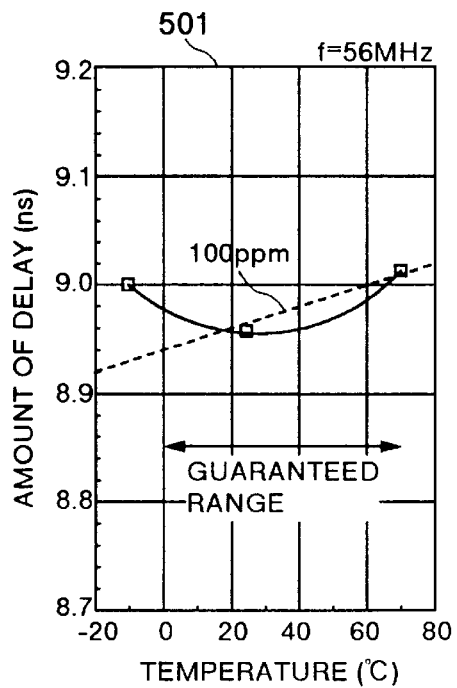

FIGS. 18A and 18B show in graphs examples of effect of the LSI circuit of the window adjustment delay line section according to the present invention. In the graph of measured results of dependence of the amount of delay on power voltage 500 (FIG. 18A), the ratio of variation in the amount of delay is 1% or less in the guaranteed range of circuit operation, 5 V±10%. This indicates a favorable power voltage dependence. Moreover, according to the graph of measured results of dependence of amount of delay on temperature 501 (FIG. 18B), the ratio of variation in the amount of delay is about 100 ppm in the guaranteed temperature range of the circuit, 0° C. to 70° C., indicating a favorable temperature dependence.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:

1. A data acquisition circuit for acquiring sampled data in response to a sampling clock signal synchronized with input data thereto, comprising a phase adjustment circuit for achieving a phase adjustment of the sampled data, wherein the phase adjustment circuit includes a signal processing delay circuit including first delay means including first analog variable delay circuit of which an amount of delay is controlled according to an external reference signal, the first delay means generating a delay amount control signal and second delay means including second analog variable delay circuit in which an amount of delay of an input signal thereto is controlled according to the delay amount control signal generated by the first delay means.

2. A data acquisition circuit according to claim 1, further including means for creating a sampling clock signal synchronized with the input data.

3. A signal recording and reproducing system, comprising:
   a recording medium;
   a sensor for recording a signal on the recording medium or reproducing a signal from the recording medium;
   a signal processing circuit for processing a record signal to the sensor or a reproduction signal therefrom;

an interface circuit for communicating as data items the processed record and reproduction signals;

a processor for controlling operation of the system;

a data acquisition circuit for acquiring sampled data in response to a sampling clock signal synchronized with input data thereto, the data acquisition circuit comprising a phase adjustment circuit for achieving a phase adjustment of the sampled data;

the phase adjustment circuit including a signal processing delay circuit including first delay means including a first analog variable delay circuit of which an amount of delay is controlled according to an external reference signal, the first delay means generating a delay amount control signal and second delay means including a second analog variable delay circuit in which an amount of delay of an input signal thereto is controlled according to the delay amount control signal generated by the first delay means; and/or a data write circuit for writing data on a recording medium, the data write circuit including a write pre-compensation circuit for conducting a positional compensation of data according to a data pattern of the data, the write pre-compensation circuit including a signal processing delay circuit including first delay means including a first analog variable delay circuit of which an amount of delay is controlled according to an external reference signal, the first delay means generating a delay amount control signal and second delay means including a second analog variable delay circuit in which an amount of delay of an input signal thereto is controlled according to the delay amount control signal generated by the first delay means.

* * * * *